United States Patent [19]

Houston et al.

[11] Patent Number: 5,046,044

[45] Date of Patent: Sep. 3, 1991

[54] SEU HARDENED MEMORY CELL

[75] Inventors: Theodore W. Houston, Richardson; Terence G. Blake, Dallas, both of Tex.

[73] Assignee: Texas Instruments Incorporated, Dallas, Tex.

[21] Appl. No.: 563,722

[22] Filed: Aug. 1, 1990

Related U.S. Application Data

[63] Continuation of Ser. No. 288,541, Dec. 21, 1988, abandoned.

[51] Int. Cl.⁵ ............................................. G11C 11/40
[52] U.S. Cl. ..................................... 365/156; 365/154; 365/190
[58] Field of Search ................ 365/154, 156, 181, 190

[56] References Cited

U.S. PATENT DOCUMENTS

| | | | |
|---|---|---|---|
| 4,660,177 | 4/1987 | O'Connor | 365/154 X |
| 4,724,530 | 2/1988 | Dingwall | 365/156 |
| 4,760,557 | 7/1988 | Stewart et al. | 365/154 |
| 4,805,148 | 2/1989 | Diehl-Nagle et al. | 365/154 |

Primary Examiner—Joseph A. Popek
Attorney, Agent, or Firm—Stanton C. Braden; James T. Comfort; Melvin Sharp

[57] ABSTRACT

A memory cell is disclosed comprising cross-coupled inverters including gated diodes connected in the cross-coupling which increase the memory cell's resistance to single event upset. The layouts for constructing such a memory cell, which optimize READ and WRITE speeds, are also disclosed.

4 Claims, 12 Drawing Sheets

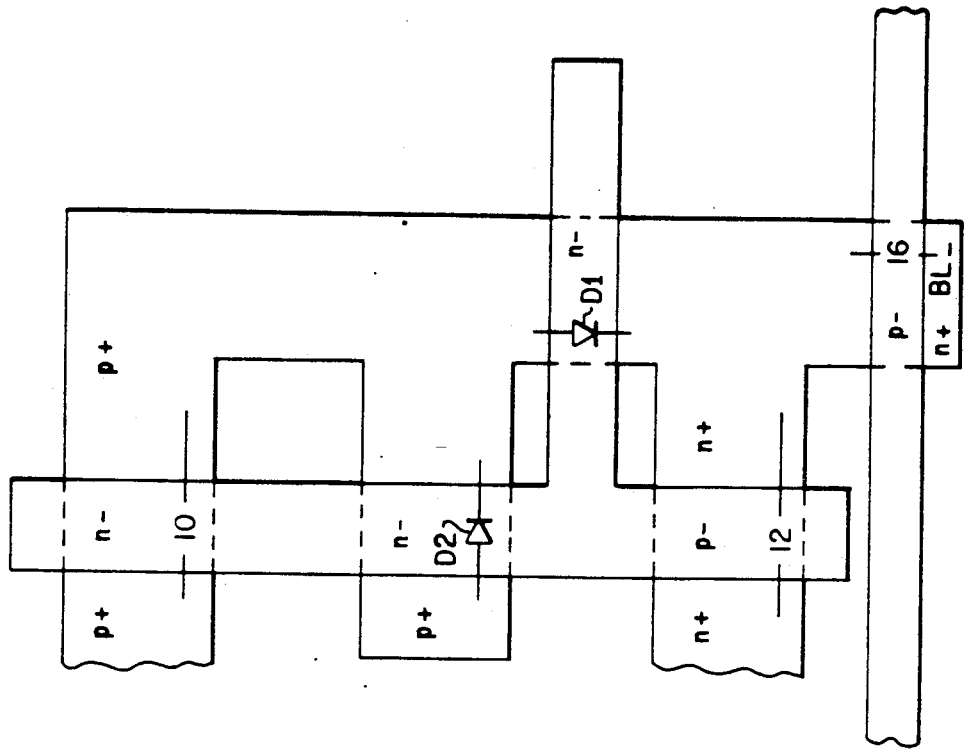
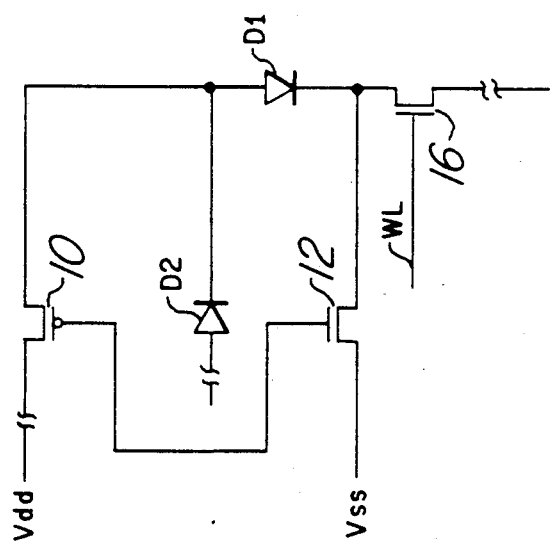
Fig. 9b
Fig. 9a

SEU HARDENED MEMORY CELL

This invention was made with Government support under contract number F29601-86-C-0020.

This application is a Continuation of application Ser. No. 288,541, filed Dec. 21, 1988, now abandoned.

FIELD OF THE INVENTION

This invention is in the field of integrated circuits and is specifically directed to static random access memories.

BACKGROUND OF THE INVENTION

Static memory cells in certain environments such as communication satellite orbital space are, or will likely be particularly susceptible to soft errors or single event upsets (SEUs). See E. G. Gussehower, K. A. Lynch and D. H. Brenteger, "DMPS Dosimetry Data: A Space Measurement and Mapping of Upset Causing Phenomena," IEEE Trans. Nuclear Science NS-34, pp. 1251–1255 (1987) and H. T. Weaver, et al., "An SEU Tolerant Memory Cell Derived from Fundamental Studies of SEU Mechanisms in SRAM," IEEE Trans. Nuclear Science, NS-34, pp. 1281–1286 (1987). A soft error or single event upset (SEU) typically is caused by electron-hole pairs created by, and along the path of a single energetic particle as it passes through an integrated circuit, such as a memory. Should the energetic particle generate the critical charge in the critical volume of a memory cell, then the logic state of the memory is upset. This critical charge, by definition, is the minimum amount of electrical charge required to change the logic state of the memory cell. The critical charge may also enter the memory through direct ionization from cosmic rays. See T. C. May and M. H. Woods, "Alpha Particle Induce Soft Errors in Dynamic Memories," IEEE Trans. Electronic Devices, ED-26, p. 2 (1979) and J. C. Pickel, J. T. Blaudfood, Jr., "CMOS RAM Cosmic Ray-Induce Error Rate Analysis," IEEE Trans. on Nuclear Science, Vol. NS-28, pp. 3962–3967 (1981). Alternatively, the critical charge may result from alpha particles (helium nuclei). One example of SEU can be seen in FIG. 1 which illustrates a cross-sectional view of a CMOS inverter. When alpha particle p strikes bulk semiconductor material in p-channel MOS transistor Pch, it generates electron-hole pairs as shown by the respective minus and plus marks. Assuming that the n-channel transistor Nch is on and that p-channel transistor P-ch is off, the holes (indicated by plus signs) which collect (see arrows toward drain D) at drain D can change the voltage at output OUT from a logic low to a logic high. The electrons as indicated by the minus signs will diffuse toward circuit supply voltage Vcc. A charge generating particle hit on transistor Nch has the opposite effect with positive charge drifting towards ground and negative charges collecting at output OUT, thus possibly changing the logic state of the inverter.

A memory cell which provides hardening against SEU was described in application Ser. No. 241,681, filed Sept. 7, 1988. A schematic drawing of this cell is illustrated in FIG. 2. Memory cell 2 is constructed according to well known methods of cross-coupled inverter realization and thus CMOS inverters are used in memory cell 2. A first CMOS inverter 4 in memory cell 2 is made up of p-channel transistor 6 and n-channel transistor 8 having their source-to-drain paths connected in series between Vdd and ground, and having their gates tied together. The second CMOS inverter 5 in memory cell 2 is similarly constructed, with p-channel transistor 10 and n-channel transistor 12 having their source-to-drain paths connected in series between Vcc and ground and their gates also common. The cross-coupling is accomplished by the gates of transistors 6 and 8 being connected to the drains of transistors 10 and 12 being connected to the drains of transistors 10 and 12 (node S1 of FIG. 1b), and by the gates of transistors 10 and 12 being connected to the drains of transistors 6 and 8 (node S2 of FIG. 1b). The above described arrangement and structure of inverter 4 coupled to inverter 5 are commonly referred to as cross-coupled inverters, while the lines connecting gates and drains are each referred to as a cross-coupling line. N-channel transistor 14 has its source-to-drain path connected between node S2 and a first bit line BL, and has its gate connected to word line WL. N-channel pass transistor 16 similarly has its source-to-drain path connected between node S1 and a second bit line BL_, and has its gate also connected to word line WL. Pass transistors 14, 16 when enabled, allow data to pass into and out of memory cell 2 from bit lines BL and BL_ respectively. Bit lines BL and BL_ carry data into and out of memory cell 2. Pass transistors 14, 16 are enabled by word line WL which is a function of the row address in an SRAM. The row address is decoded by a row decoder in the SRAM such that one out of n word lines is enabled, where n is the number of rows of memory cells in the memory which is a function of memory density and architecture. P-channel transistors 22 and 24 are connected across an associated cross-coupling line joining the input of one inverter to the output of another inverter. Additionally, the gate of transistor 22 is common with that of transistor 6 and the gate of transistor 24 is common with that of transistor 10. This circuit can be built on a thin film which lies on an insulator such as is done in silicon on insulator technology (SOI).

In operation, the voltages of nodes S1 and S2 will necessarily be logical complements of one another, due to the cross-coupled nature of CMOS inverters 4, 5 within memory cell 2. When word line WL is energized by the row decoder (not shown), according to the row address received at address inputs to an address buffer (not shown) connected to the row decoder, pass transistors 14, 16 will be turned on, coupling nodes S1 and S2 to bit lines BL_ and BL respectively. Accordingly, when word line WL is high, the state of memory cell 2 can establish a differential voltage on BL and BL_. Alternatively, peripheral circuitry forcing a voltage on BL and BL_ can alter the state of memory cell 2. The sizes of the transistors shown in FIG. 1 are generally chosen such that when pass transistors 14, 16 are turned on by word line WL; a differentially low voltage at bit line BL with respect to bit line BL_ can force node S2 to a logic low level; and a differentially low voltage at bit line BL_ with respect to bit line BL can force node S1 to a logic low level. However, the sizes of the transistors shown in FIG. 2 are also chosen such that when transistors 14 and 16 are on; a differentially high voltage at bit line BL with respect to bit line BL_ will not force node S2 high; nor will a differentially high voltage at bit line BL_ with respect to bit line BL force node S1 high. Therefore writing into memory cell 2 is accomplished by pulling the desired bit line and thus the desired side of cell 2 at either node S1 or node S2 low, which in turn due to feedback paths in cell 2, causes the opposite side of cell 2 to have a logic high state.

SEU protection is provided by the circuit shown in FIG. 2 in that transistors 22 and 24 provide additional delay in the feedback paths so as to allow recovery of the memory cell from a energetic particle hit. The gate capacitances of transistors 22 and 24 provide SEU protection both by increasing the feedback delay and by decreasing the voltage change incurred by collection of a given amount of charge. However, the layout for the cell shown in FIG. 2 does not necessarily optimize the amount of capacitance achieved which is capable of being produced within the given cell size. For instance, in certain situations even more SEU hardening may be required than possible within the memory cell of FIG. 2 within a given cell size.

OBJECTS OF THE INVENTION

It is and object of the invention to provide a new and improved memory cell.

It is another object of the invention to provide a new and improved memory cell with SEU protection.

It is still another object of the invention to provide for a memory, optimal SEU protection within a given SRAM cell size.

SUMMARY OF THE INVENTION

The foregoing objects of the invention are accomplished by a memory cell including two cross-coupled inverters wherein each inverter includes a voltage pull-up device connected to a voltage pull-down device. Each pull-up and pull-down device has a gated diode which is formed between the outputs of pull-up and pull-down devices of each inverter.

BRIEF DESCRIPTION OF THE DRAWINGS

FIG. 8a is an alternative embodiment of the schematic drawing illustrated in FIG. 7a.

FIG. 8b illustrates a layout for the circuit shown in FIG. 8a.

FIGS. 9a, 10a, 11a, 12a, and 13a illustrate schematic drawings of one half of a memory cell including symmetrical halves.

FIGS. 9b, 10b, 11b, 12b, and 13b illustrate cell layouts of the schematic drawings shown in 9a, 10a, 11a, 12a, and 13a respectively.

DETAILED DESCRIPTION OF THE INVENTION

Figure 2:
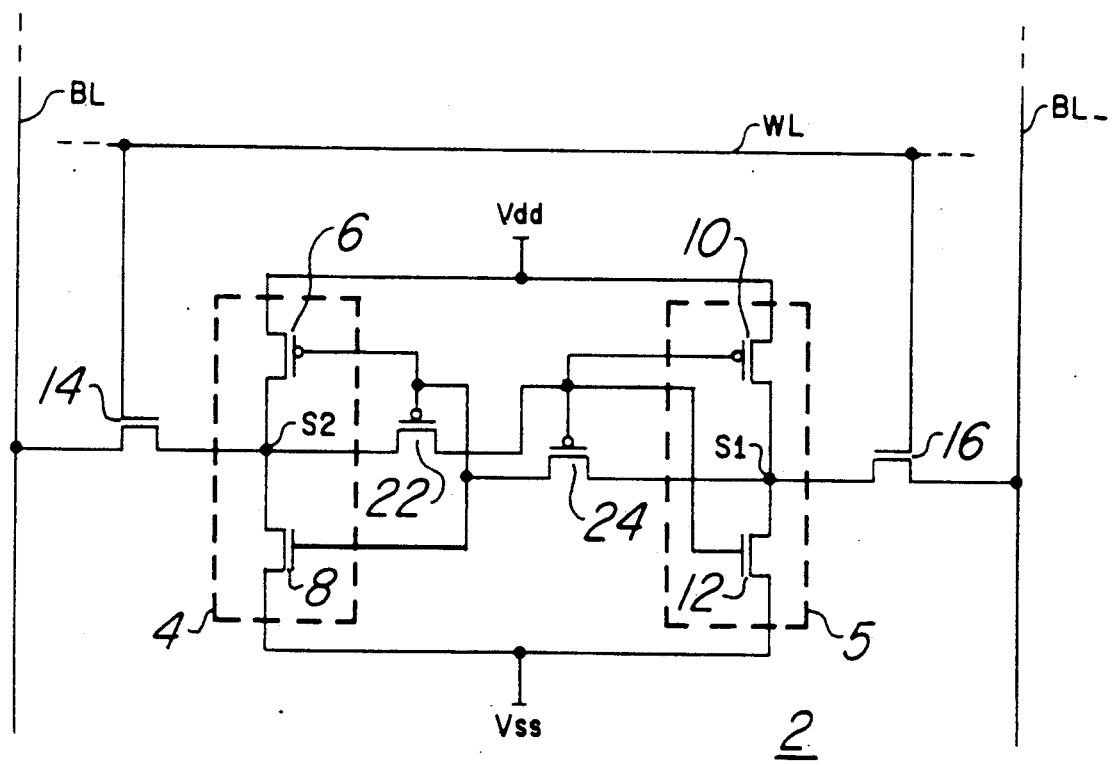
FIG. 2 is a schematic drawing of a prior art memory cell.
Figure 3:
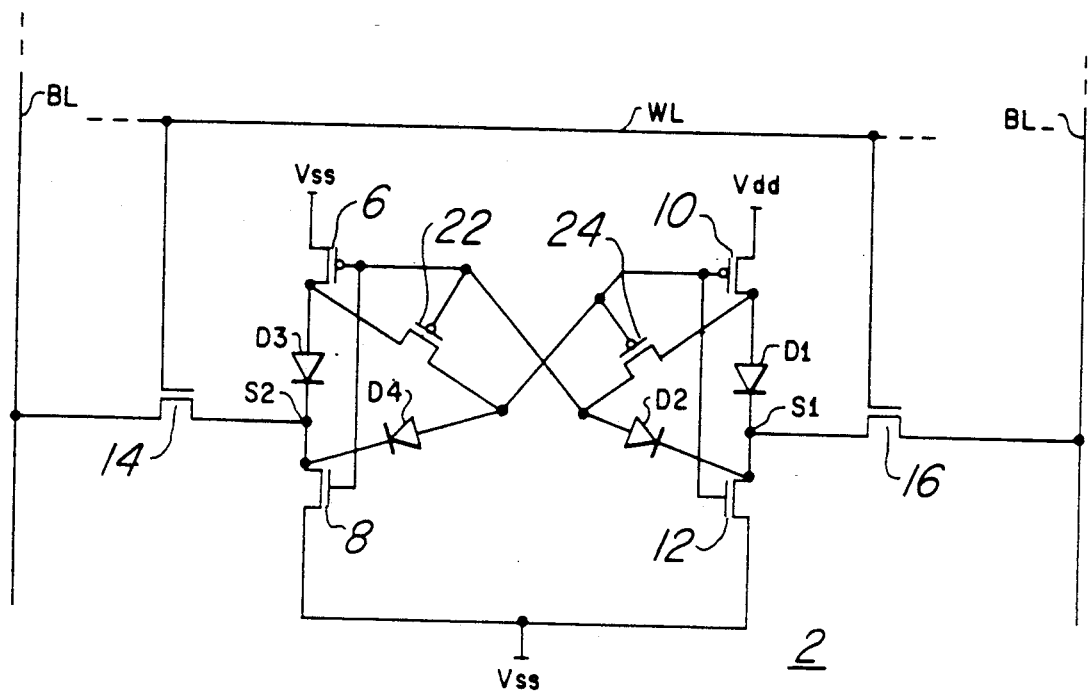
FIG. 3 illustrates a schematic drawing of a first preferred embodiment of the invention.

FIG. 3 illustrates a schematic drawing of a first preferred embodiment of the invention. This circuit is like that shown in FIG. 2 except that diode D1 is connected to and between the drain of transistor 10 and node S1, and diode D2 is connected to a source/drain of transistor 24 and node S1. Other differences are that diode D3 is connected to and between the drain of transistor 6 and node S2, and diode D4 is connected to a source/drain of transistor 22 and node S2.

A description of the operation of the circuit shown in FIG. 3 follows. Should node S2 be low in voltage relative to node S1, an energetic particle hit on the body of transistor 12 may lower the voltage at node S1, but the delay introduced by the combination of diodes D1, D2 and transistor 24 allows recovery of the cell from the hit such that the voltage on node S1 returns to its voltage state just before the hit. Should node S2 be high in voltage relative to node S1, an energetic particle hit on the body of transistor 10 will not propagate a resulting voltage change through the cell since paths to the other side of the cell are blocked by transistor 24 and diode D2. A similar analysis is applicable to energetic particle hits on transistors 6 and 8 since symmetrical circuit structures in the cell are involved. Thus, with node S2 low with respect to node S1, an energetic particle hit on the body of transistor 6 will not propagate a resulting voltage change through the cell since paths to the other side of the cell are blocked by transistor 22 and diode D4. If node S2 were high with respect to node S1, delay introduced by the combination of diodes D3, D4, and transistor 22 will allow recovery from an energetic particle hit on the body of transistor 8. Note that the above discussed additions to FIG. 2 shown in FIG. 3 do not substantially increase READ or WRITE cycle times of the cell.

Figure 4:
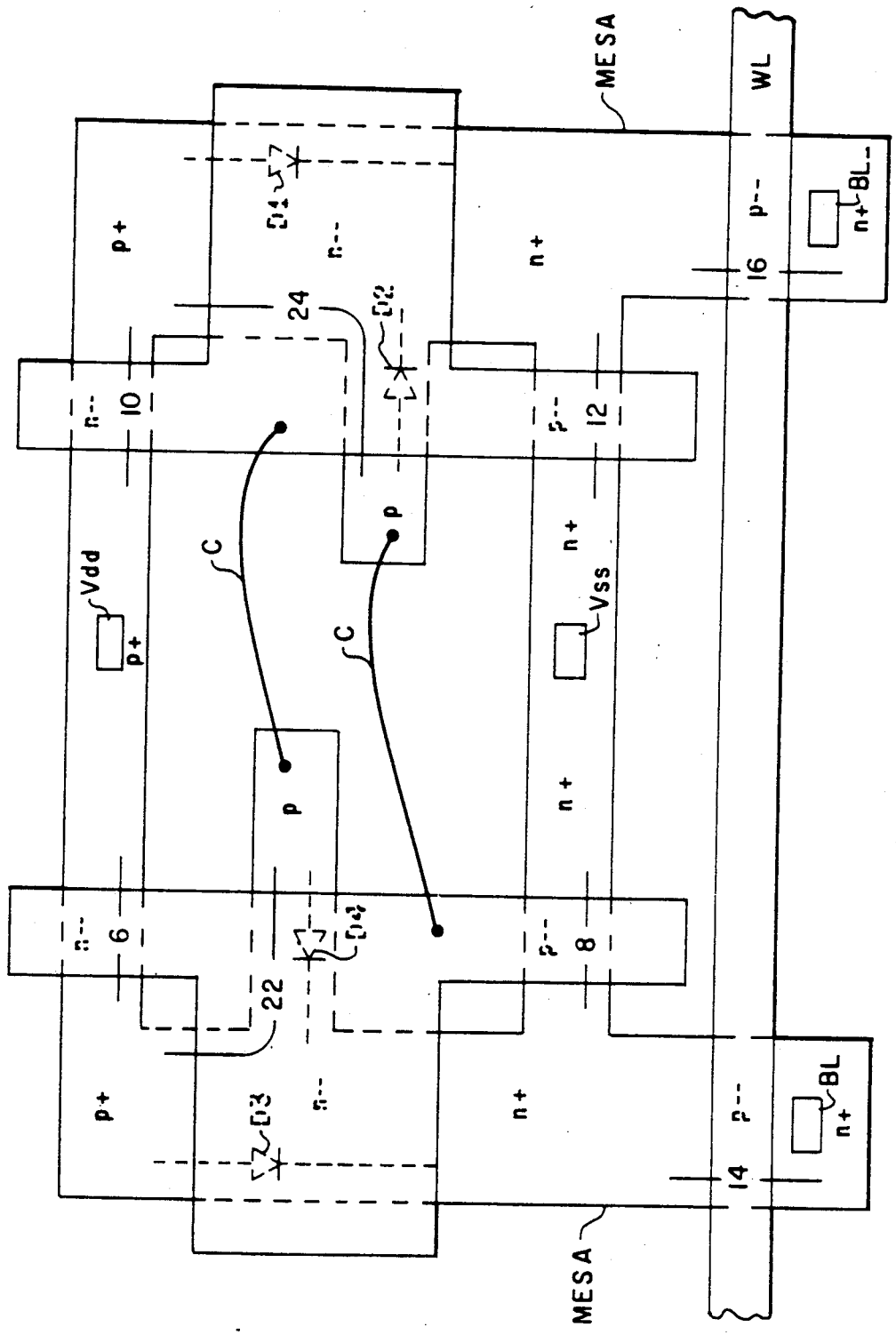
FIG. 4 is a preferred embodiment of the layout of the circuit of FIG. 3 and it is a drawing of a portion of superimposed fabrication masks.

A preferred embodiment of the layout of the circuit shown in FIG. 3 is illustrated in FIG. 4 which is a drawing of a portion of superimposed fabrication masks. An advantage of this layout over the prior art includes the fact that it allows a larger amount of capacitance to be obtained in the same cell area. The positions of the labeled elements in FIG. 3 are indicated in FIG. 4. Lines on either side of label numbers indicate extention of an element over the length of the line. For optimal SEU protection, the circuit of FIG. 3 is built on a thin film of semiconductor material which lies on an insulator. Thus, as shown in FIG. 4 the circuit is built on a mesa. Doping impurity types in regions of the mesa are labeled p and n with plus or minus signs indicating a higher and lower dopant concentration respectively. Gates for transistors overlie the mesa. Mesa areas under the gate are shown by dashed lines. Diode positions are shown by diode symbols. Extension of the gate of transistor 24 across the MESA between transistors 10 and 12 results in the separation of transistors 10 and 12 by diode D1. Extra capacitance is also achieved by this extension. Additionally, diode D2 is formed from a source/drain to body of transistor 24 as shown. Likewise, the gate of transistor 22 is extended across the MESA between transistors 6 and 8. Diodes D3 and D4 are formed from a source/drain to body of transistor 22 as shown. Transistors 22 and 24 may have n-type and p-type connections to either or both their sources and drains so as to maintain a high amount of capacitance during times when both high or low voltages are on their sources and drains. Contact positions for connection to bit lines BL and BL— are also indicated along with contact positions for voltage connections to Vdd and Vss. Lines labeled C represent cross coupling connections between opposite sides of the memory cell.

Figure 5:
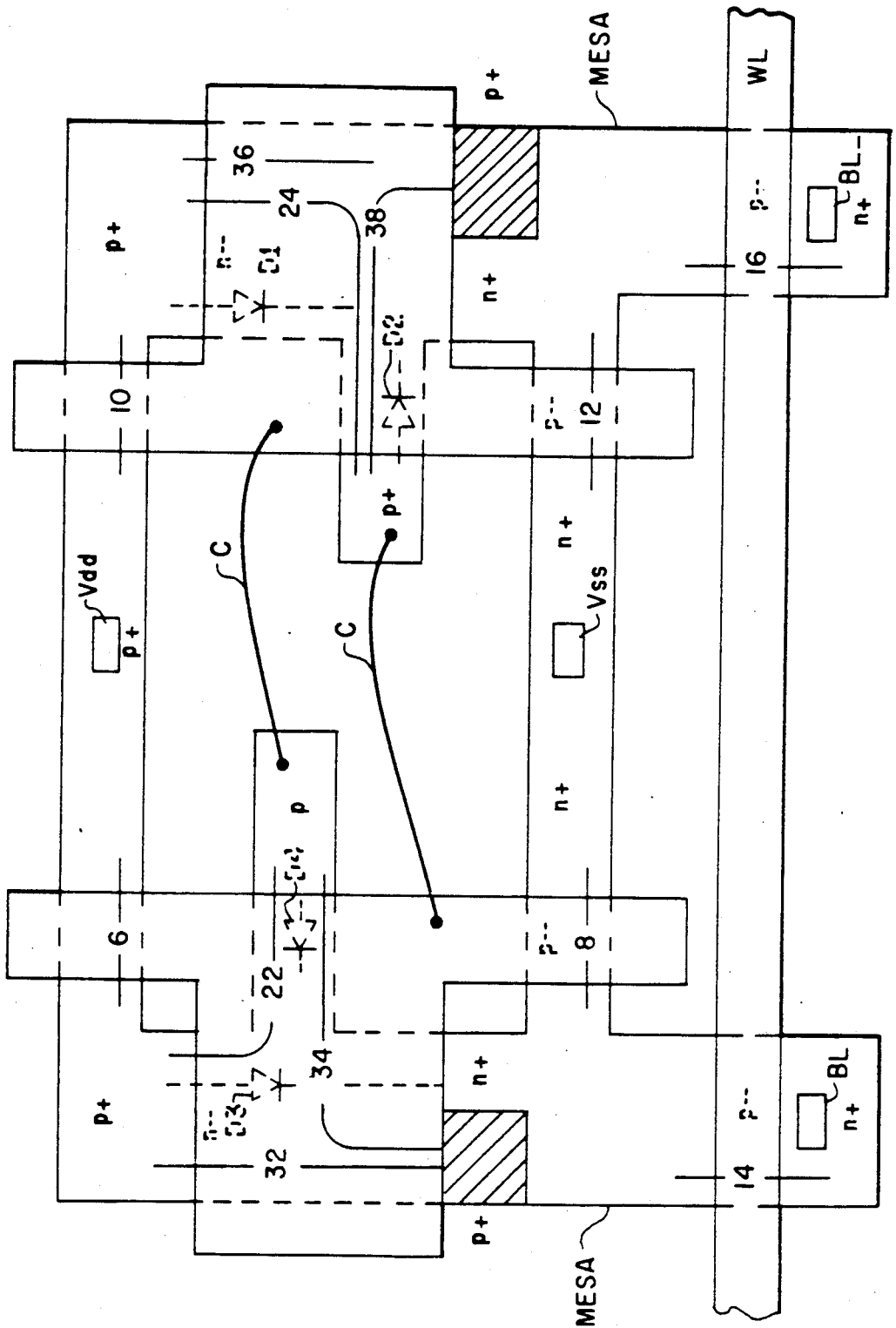
FIG. 5 is an alternative embodiment of the layout for the memory cell.

An alternative embodiment which also has increased capacitance within the same cell area forms a p+ region on each side of the cell in the layout of FIG. 4. This embodiment is illustrated in FIG. 5 which like FIG. 4 is a drawing of a portion of superimposed fabrication masks which show the layout of a circuit. The positions of these subject p+ regions are indicated by the diagonal lines. FIG. 5 shows substantially the same layout as FIG. 4 as well as the positions of elements formed as a consequence of the added p+ regions.

Figure 6:
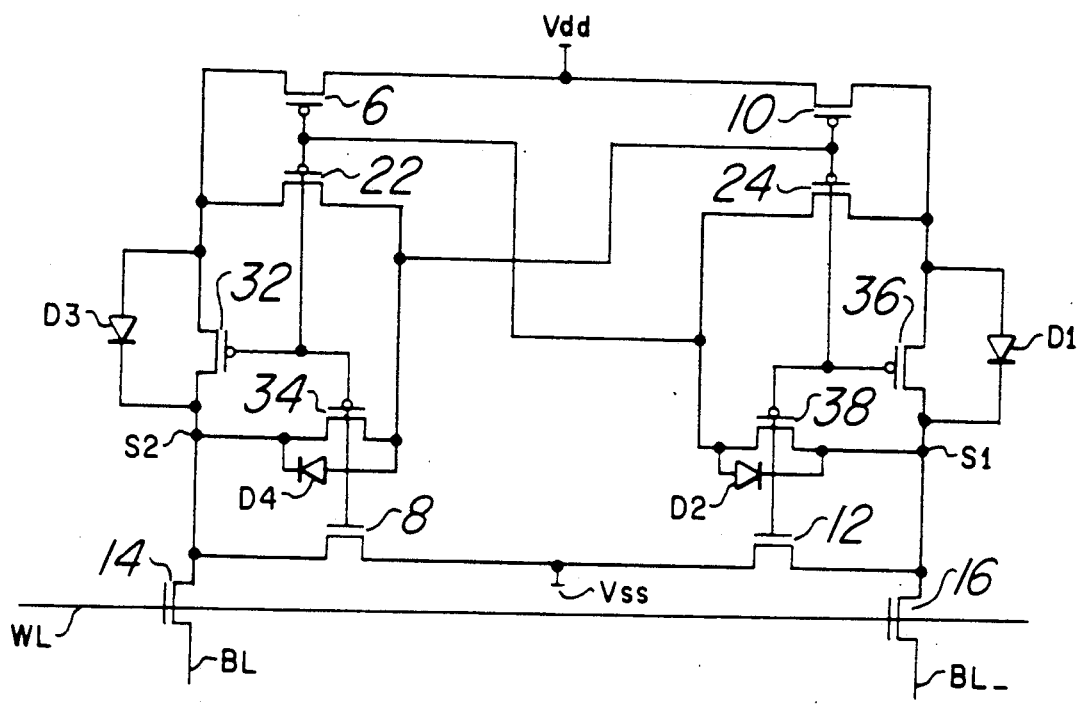
FIG. 6 is a schematic drawing of the circuit achieved from the layout shown in FIG. 5.

A schematic drawing of the circuit achieved from the layout shown in FIG. 5 is illustrated in FIG. 6. The added p+ region on the right side of the cell helps form p-channel transistors 32 and 34. The added p+ region on the left side of the cell helps form p-channel transistors 36 and 38. The positions of transistors 32, 34, 36, and 38 are indicated in FIG. 4 where lines on either side of the label numbers indicate extension of the transistors along the length of the transistor. Note that transistors 32, 34, 36, and 38 are each in parallel with a diode. When either nodes S1 and S2 are high, this arrangement helps keep them high since extra paths from Vdd are provided. Additionally, the addition of transistors 32, 34, 36 and 38 increase READ speed over that achieved by a circuit without them. SEU protection is achieved by the capacitance introduced by the transistors and diodes which contribute sufficient RC time constant delay to allow recovery of the memory cell from a energetic particle hit. Furthermore, like that of FIG. 4 extra capacitance results from the extension of gate areas over mesa areas as shown in FIG. 5. This too contributes to capacitive delay in the circuit which increases SEU hardening. As with FIG. 3 the WRITE and READ speeds of the circuit shown in FIG. 6 is not substantially increased over the WRITE and READ speeds of the circuit in FIG. 3.

Figure 7B:
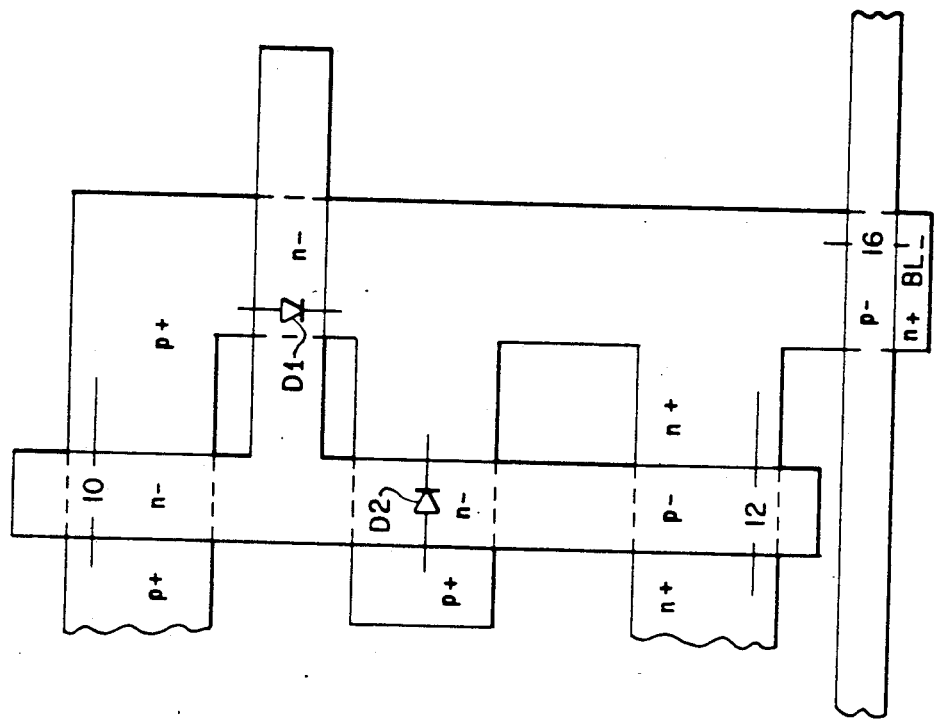
FIG. 7b is a layout of the circuit of FIG. 7a which illustrates superimposed mask portions.
Figure 7A:
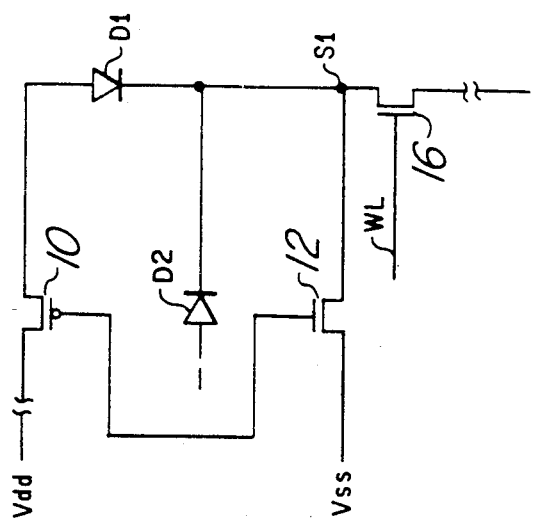
FIG. 7a is a schematic drawing of another alternative embodiment of the invention.

FIG. 7a is a schematic drawing of another alternative embodiment of the invention. Only one half of the cell is shown for ease of illustration. Similar elements exist on the other side of the cell since this is a symmetrical structure. Transistors in the cross-coupling have been eliminated, thus as shown FIG. 7a is similar to FIG. 3 except that FIG. 3's transistor 24 is no longer present. Therefore transistor 22 can be eliminated as well. This cell like the other previously discussed embodiments allows increased capacitance within a give cell size.

A layout of the circuit of FIG. 7a is shown in FIG. 7b which illustrates superimposed mask portions. The positions of the transistors and diodes of FIG. 7a are labeled as well as the doping types in a manner similar to that of FIG. 4. Note that the layout of FIG. 7b is achieved by more narrowly extending the common gate of transistors 10 and 12 over the mesa between transistors 10 and 12.

Figure 8B:
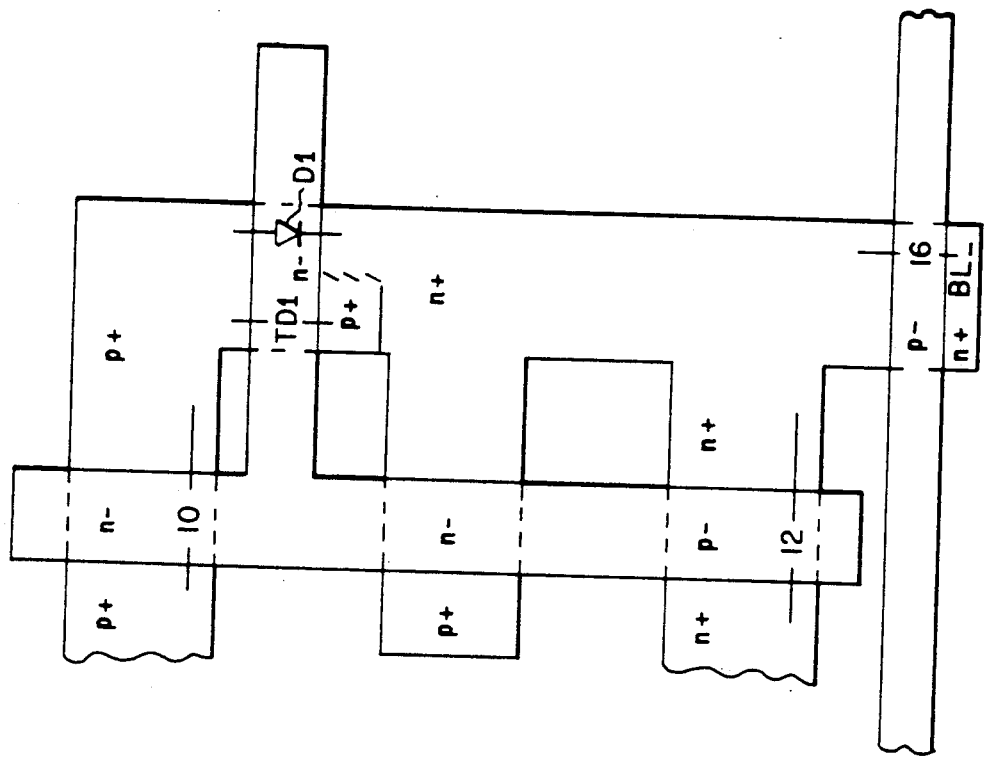
Figure 8A:
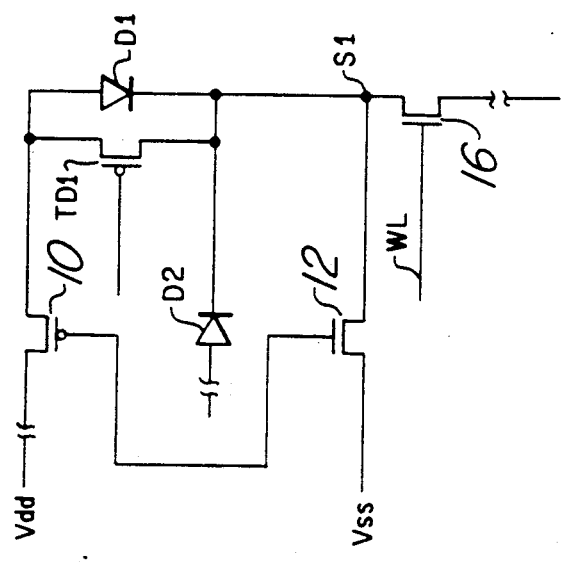

FIG. 8a is an alternative embodiment of the schematic drawing illustrated in FIG. 7a. FIG. 8a is the same as FIG. 7a except that transistor TD1 has been added so as to be in parallel with diode D1. Another transistor can be placed in parallel with a diode on the other side so as to maintain symmetry in the cell.

FIG. 8b illustrates the same layout of FIG. 7b with the exception that a p+ region has been added which is connected to an adjacent n+ region as indicated by the diagonal slash marks at the boundary of the n+ and p+ regions. The connection may be made with silicide or metal for example. This p+ region causes the formation of transistor TD1 as indicated by the labeled position of transistor TD1.

A variety of transistors and diodes may be formed by the extension of the gate common to transistors 10 and 12 of the foregoing drawings over the mesa between transistors 10 and 12. These transistors and diodes can provide increased delay without significantly slowing WRITE or READ speeds. A symmetrical arrangement results when a similar gate extension is performed on the other half of the cell. FIGS. 9a and 9b represent a schematic drawing and layout respectively, of half of a circuit. The elements, doping types, and connected adjacent regions are indicated as in the previous drawings. Note however, that the extension of the gate common to transistors 10 and 12 is closer to transistor 12.

Figure 10B:
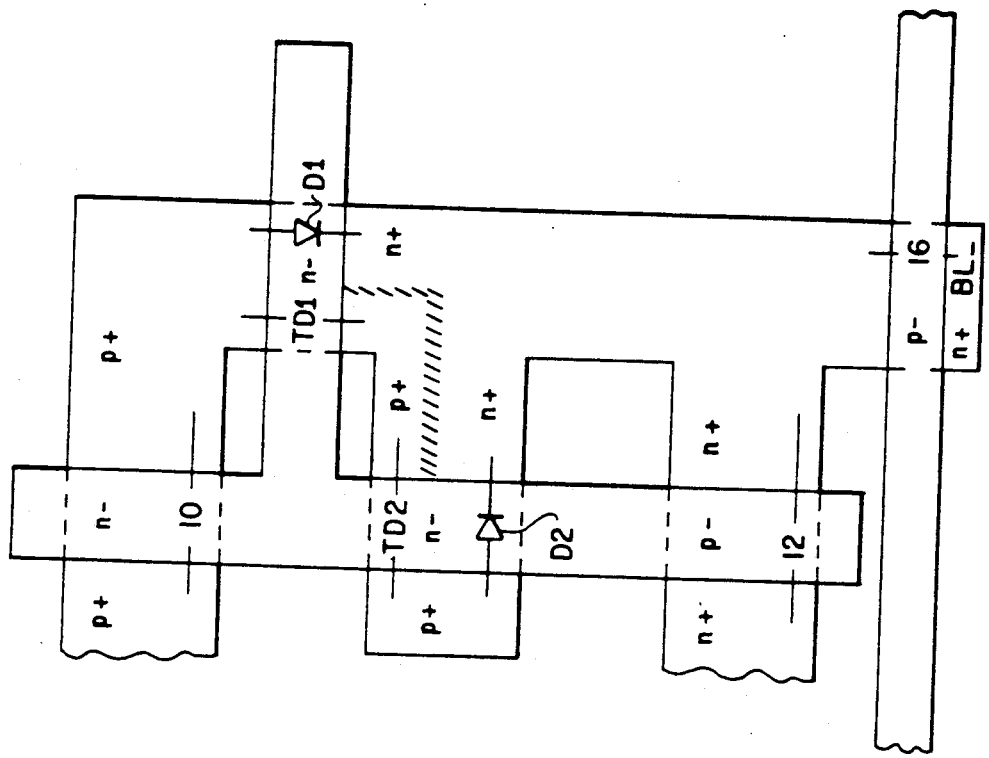
Figure 10A:
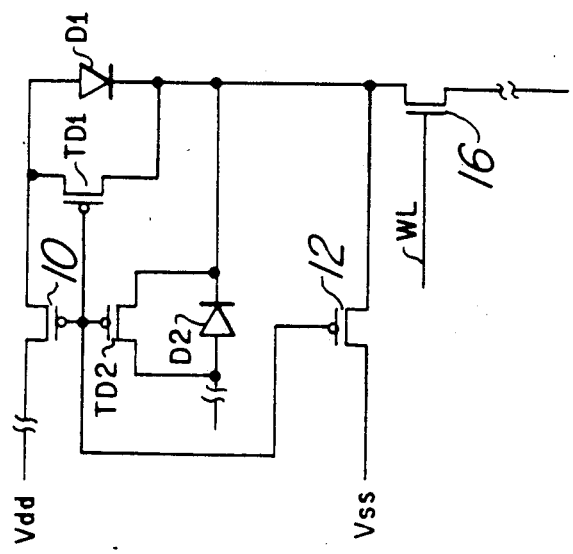

FIG. 10a is a schematic drawing of an alternative embodiment of the schematic of FIG. 7a. This drawing is nearly the same as that of FIG. 7a with the exception that transistors TD1 and TD2 are in parallel with diodes D1 and D2 respectively.

FIG. 10b is a layout of the circuit of 10a which adds a p+ region connected to an adjacent n+ region as indicated by the diagonal slash marks at the boundary of the n+ and p+ regions. As before, a symmetrical arrangement exists on the other side of the cell.

Figure 1:
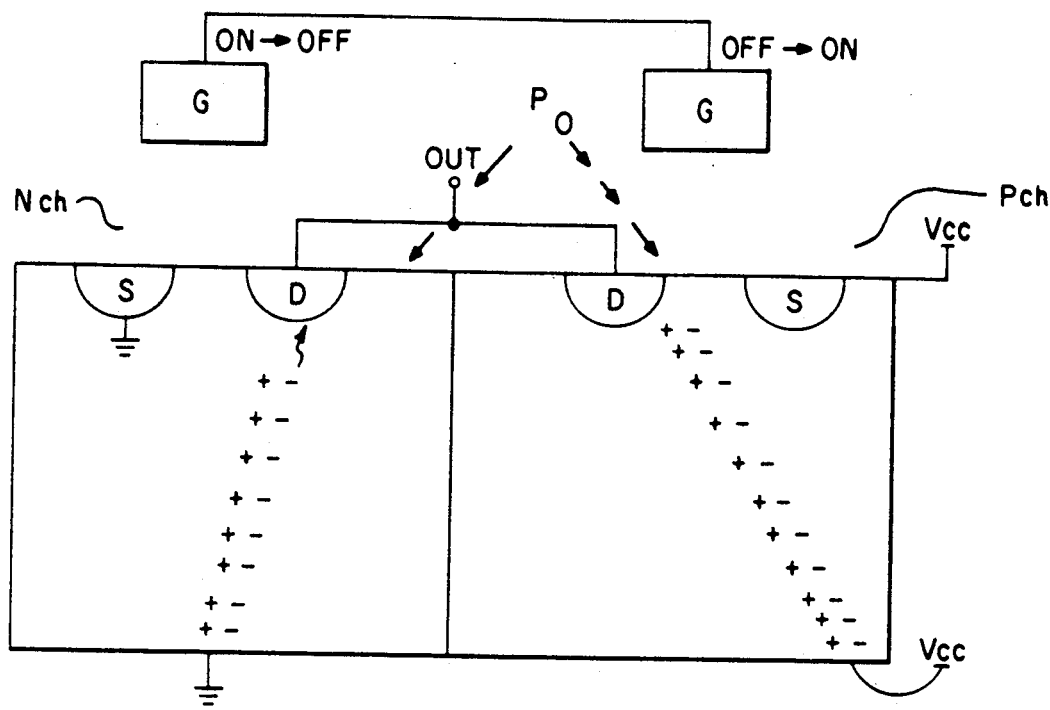
FIG. 1 is a cross-sectional view of a CMOS inverter.
Figure 11B:
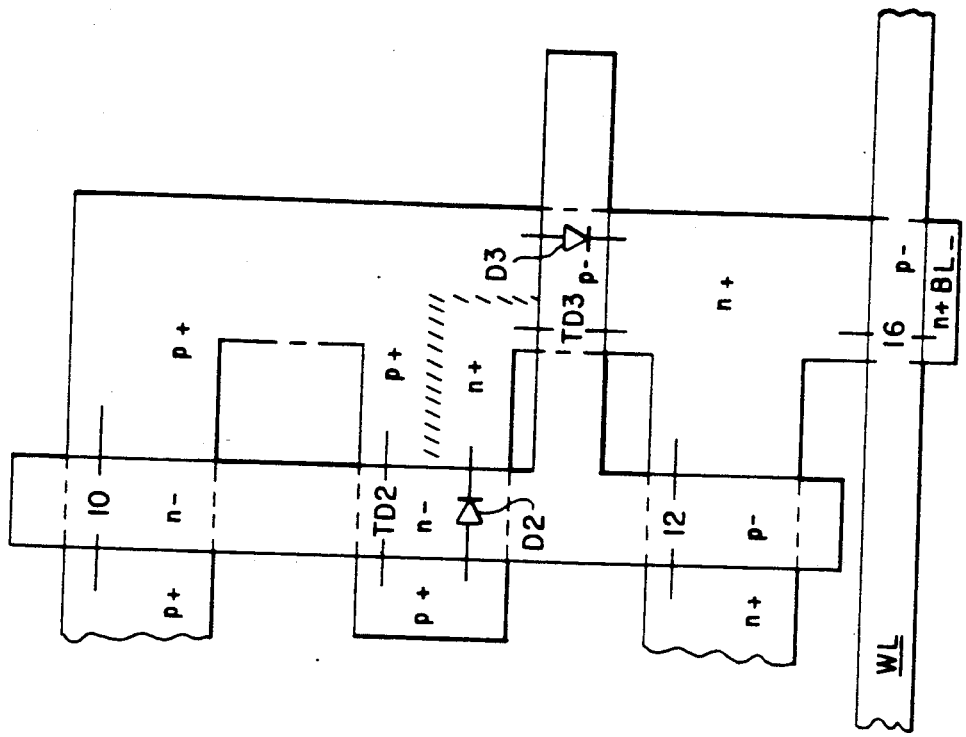
Figure 11A:
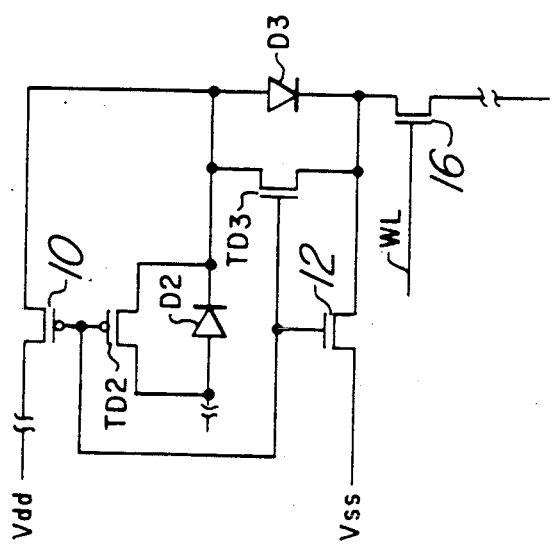
Figure 12B:
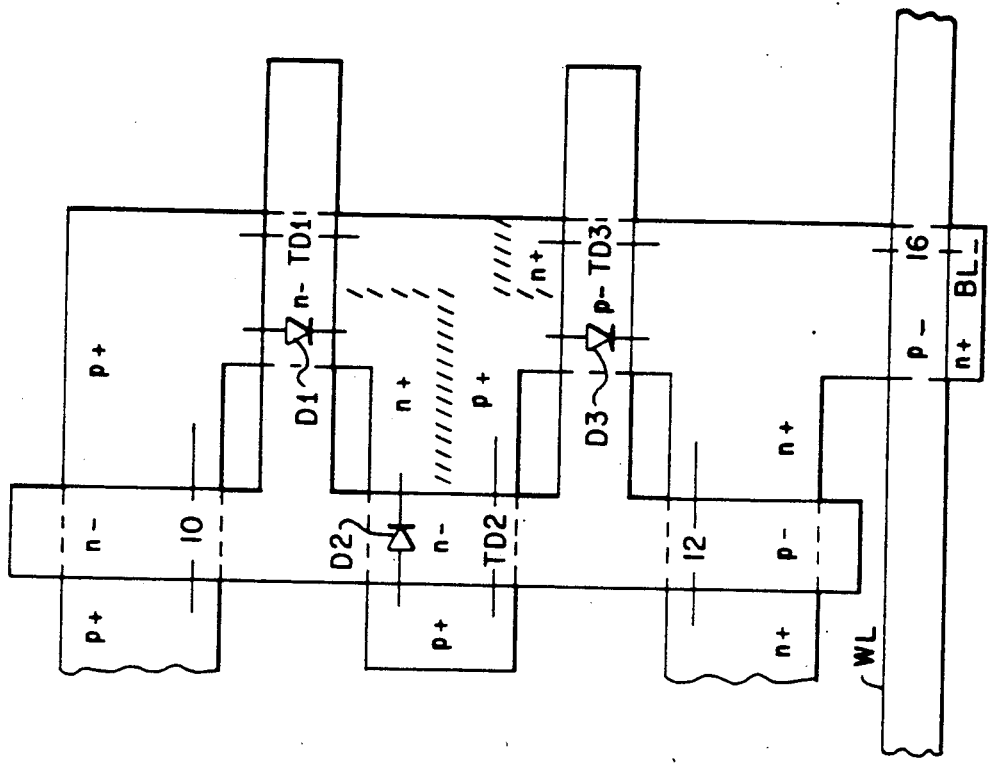
Figure 12A:
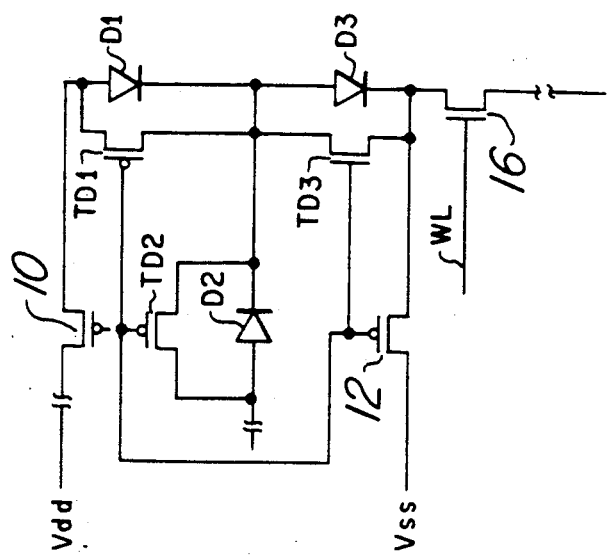
Figure 13B:
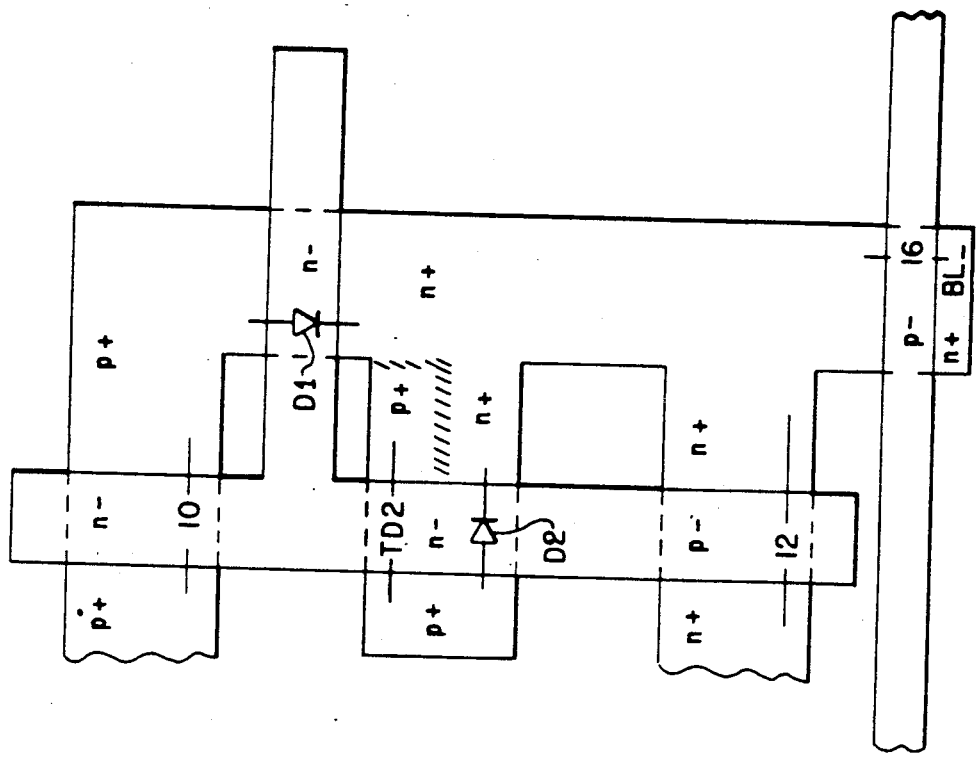
Figure 13A:
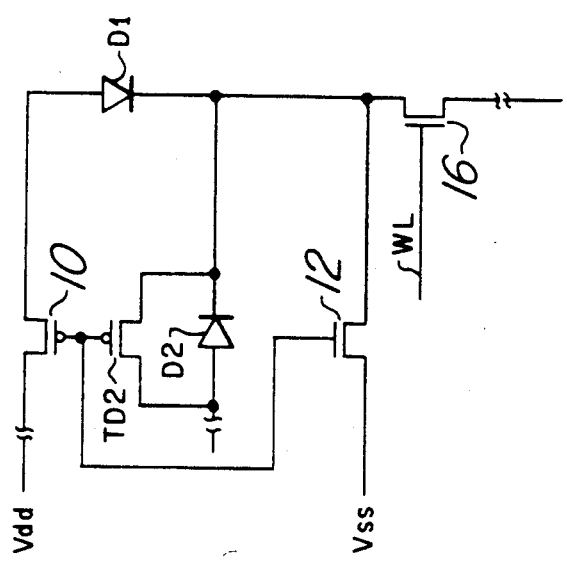

Still other embodiments of the invention are shown in the schematic drawings illustrated in FIGS. 11a, 12a, and 13a. Their corresponding layouts, which optimize the amount of delay through the addition of capacitance without significantly slowing WRITE or READ speeds, are shown in FIGS. 11b, 12b, and 13b respectively. These figures illustrate superimposed mask portions that are indicative of the position of elements in the schematic drawings. The elements, doping types and connected adjacent regions are indicated as before with the previous drawings. FIGS. 11a and 1b place two transistors TD2 and TD3 in parallel with two diodes D2 and D3 respectively . FIG. 12 places three transistors TD1, TD2, and TD3 in parallel with three diodes D1, D2, and D3 respectively. FIGS. 13a and 13b place one diode D2 in parallel with one transistor TD2.

Although the invention has been described in detail herein with reference to its preferred embodiment and certain described alternatives, it is to be understood that this description is by way of example only, and is not to be construed in a limiting sense. It is to be further understood that numerous changes in the details of the embodiments of the invention, and additional embodiments of the invention, will now be apparent to, and may be made by a person of ordinary skill in the art having reference to this description. For instance, n-channel transistors may be substituted for p-channel transistors consistently throughout and vice-versa. Additionally p-type areas may be substituted with n-type areas and vice-versa. Alternatively, other load devices can be substituted for the transistor loads in the memory cell. Other active, as well as passive loads are contemplated. Although complementary field effect transistors such as CMOS transistors are shown in the drawings as illustrative of memory cell elements, bipolar transistors, JFETs and MESFETs are also contemplated. Furthermore, the foregoing described invention may be fabricated on a thin film of semiconductor material, such as silicon, which overlies an insulator as is done in silicon on insulator technology. It is contemplated that all such changes and additional embodiments are within the spirit and true scope of the invention as claimed below. Accordingly, the invention is intended to be limited only by the scope of the appended claims.

I claim:

1. A memory cell comprising:

two cross-coupled inverters each including a p-channel transistor and an n-channel transistor, said p and n channel transistors in a respective inverter sharing a common gate, each inverter further including a first diode connected to and between the n-channel transistor and the p-channel transistor;

second diodes connected between and to the gate of one inverter and a drain of a selected transistor of the other inverter, wherein the gate common to said p and n channel transistors of an inverter also overlies said first and second diodes, and wherein each second diode connects to the drain of said n-channel transistor; and coupling transistors each connected to an anode of said second diode and the drain of the p-channel transistor.

2. A memory cell as recited in claim 1 wherein said coupling transistors are p-channel transistors.

3. A memory cell comprising two cross-coupled inverters each including a pull-up element and a pull-down element, a first diode connected to and between said pull-up and pull-down elements, the cross-coupling accomplished through the connection of second diodes across associated inputs of one inverter and the pull-down element of another inverter, said cross-coupling being further accomplished through the connection of coupling transistors across associated inputs of one inverter and the pull-up element of another inverter.

4. A memory cell as recited in claim 3 wherein the input to one inverter is capacitively coupled to said first diode of the other inverter.

* * * * *